United States Patent
Wang et al.

(10) Patent No.: US 12,352,829 B2
(45) Date of Patent: Jul. 8, 2025

(54) CHIP PORT STATE DETECTION CIRCUIT, CHIP, AND COMMUNICATION TERMINAL

(71) Applicant: SHANGHAI VANCHIP TECHNOLOGIES CO., LTD., Shanghai (CN)

(72) Inventors: Yongshou Wang, Shanghai (CN); Chenyang Gao, Shanghai (CN); Sheng Lin, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 239 days.

(21) Appl. No.: 18/318,040

(22) Filed: May 16, 2023

(65) Prior Publication Data
US 2023/0288500 A1    Sep. 14, 2023

Related U.S. Application Data

(63) Continuation of application No. PCT/CN2021/130951, filed on Nov. 16, 2021.

(30) Foreign Application Priority Data

Nov. 16, 2020  (CN) .......................... 202011276886.4

(51) Int. Cl.
G01R 31/68   (2020.01)
G01R 19/155  (2006.01)
G01R 19/257  (2006.01)

(52) U.S. Cl.
CPC ........... G01R 31/68 (2020.01); G01R 19/155 (2013.01); G01R 19/257 (2013.01)

(58) Field of Classification Search
CPC .... G01R 31/68; G01R 19/155; G01R 19/257; G01R 31/31703; G01R 31/31704; G01R 31/31713; G01R 31/31718; G01R 31/31721; G01R 15/04; G01R 19/16576; G06F 13/4282; G06F 13/4068; Y02D 10/00; H04W 88/02
See application file for complete search history.

(56) References Cited

U.S. PATENT DOCUMENTS

| | | | | |
|---|---|---|---|---|
| 5,574,849 A | * | 11/1996 | Sonnier | G06F 11/1633 714/E11.032 |
| 5,964,835 A | * | 10/1999 | Fowler | H04L 49/90 709/216 |
| 6,504,357 B1 | * | 1/2003 | Hemminger | G01R 35/04 702/60 |
| 2006/0052962 A1 | * | 3/2006 | Shipton | B41J 2/04586 702/106 |

* cited by examiner

*Primary Examiner* — Jermele M Hollington
*Assistant Examiner* — Zannatul Ferdous
(74) *Attorney, Agent, or Firm* — George Guosheng Wang; Upstream Research and Patent LLC (57) ABSTRACT

Disclosed in the present invention are a chip port state detection circuit, a chip, and a communication terminal. The chip port state detection circuit, by means of a port detection conversion circuit, converts the state of a port to be detected into a corresponding voltage and respectively outputs same to a first comparator and a second comparator, which, after comparing same with a corresponding input reference voltage, output a logic signal to a chip ID determination circuit to obtain a chip ID corresponding to the state of the chip port to be detected, in order to distinguish multiple identical chips.

12 Claims, 5 Drawing Sheets

CHIP PORT STATE DETECTION CIRCUIT, CHIP, AND COMMUNICATION TERMINAL

BACKGROUND

Technical Field

The present disclosure relates to a chip port state detection circuit, as well as an integrated circuit chip including such a chip port state detection circuit and a corresponding communication terminal, and belongs to the field of integrated circuit technologies.

Related Art

With the constant increase of an integration degree of an integrated circuit and the constant diversification of a chip application environment, a new requirement is made to a chip port state detection technology. For example, when a plurality of identical chips are required to be used in a same communication terminal, the communication terminal is required to identify each identical chip.

Generally, in the prior art, a state of a specific port of the chip or states of a plurality of ports are first detected, and then different chip identifiers (IDs) are output according to different port states, for the corresponding communication terminal to identify, thereby distinguishing the plurality of identical chips.

The port of each chip includes three states, that is, a pulled-up state, a pulled-down state, and a suspended state. Identification of the chip by the communication terminal is a first operation on the chip, and the state of the port of the chip is very likely to change in use. Therefore, chip port state detection is required to be fast, low in power consumption, and real-time.

SUMMARY

A primary objective of the present disclosure is to provide a chip port state detection circuit.

Another objective of the present disclosure is to provide a chip including a chip port state detection circuit and a corresponding communication terminal.

To achieve the above objectives, the following technical solutions are used in the present disclosure.

According to a first aspect of embodiments of the present disclosure, a chip port state detection circuit is provided, which includes a port detection conversion circuit, a reference voltage generation circuit, a first comparator, a second comparator, a dynamic bias current generation circuit, and a chip ID determination circuit. The port detection conversion circuit, the reference voltage generation circuit, and the dynamic bias current generation circuit are separately connected to the first comparator and the second comparator. The first comparator and the second comparator are separately connected to the chip ID determination circuit.

The port detection conversion circuit is connected to a port to be detected of a chip to convert a state of the port to be detected into a corresponding voltage and separately output the voltage to the first comparator and the second comparator. The first comparator and the second comparator receive input reference voltages provided by the reference voltage generation circuit, compare the voltage output by the port detection conversion circuit with the input reference voltages, and then output logic signals to the chip ID determination circuit. The chip ID determination circuit outputs a chip ID corresponding to the state of the port to be detected according to the logic signals, so as to distinguish a plurality of identical chips.

Preferably, the port detection conversion circuit includes but is not limited to a first resistor and a second resistor. The first resistor and the second resistor are connected in series. A connection point between the first resistor and the second resistor is connected to the port to be detected of the chip.

Preferably, the reference voltage generation circuit includes but is not limited to a third resistor, a fourth resistor, and a fifth resistor. The third resistor, the fourth resistor, and the fifth resistor are connected in series. The third resistor, the fourth resistor, and the fifth resistor perform voltage division on a power voltage to separately obtain a high-potential reference voltage and a low-potential reference voltage.

Preferably, the first comparator includes a first comparison unit and a first shaping drive unit, and the first comparison unit is connected to the first shaping drive unit.

The second comparator includes a second comparison unit and a second shaping drive unit, and the second comparison unit is connected to the second shaping drive unit.

Preferably, the first comparison unit includes but is not limited to a first N-channel metal oxide semiconductor (NMOS) transistor, a second NMOS transistor, a first P-channel metal oxide semiconductor (PMOS) transistor, a second PMOS transistor, a third PMOS transistor, a fourth PMOS transistor, a third NMOS transistor, a fourth NMOS transistor, a fifth PMOS transistor, and a sixth PMOS transistor. A gate of the first NMOS transistor is connected to a high-potential reference voltage output end of the reference voltage generation circuit. A drain of the first NMOS transistor, a drain of the first PMOS transistor, a gate of the second PMOS transistor, a drain and a gate of the third PMOS transistor, and a gate of the fourth PMOS transistor are connected to one another. A gate of the second NMOS transistor is connected to the port detection conversion circuit. A drain of the second NMOS transistor, a drain of the second PMOS transistor, a gate of the first PMOS transistor, a drain and a gate of the fifth PMOS transistor, and a gate of the sixth PMOS transistor are connected to one another. Sources of the first NMOS transistor and the second NMOS transistor are separately connected to a first current bias end of the dynamic bias current generation circuit. A drain of the fourth PMOS transistor, a drain and a gate of the third NMOS transistor, and a gate of the fourth NMOS transistor are connected to one another. A drain of the fourth NMOS transistor, a drain of the sixth PMOS transistor, and an input end of the first shaping drive unit are connected to one another. Sources of the first PMOS transistor, the second PMOS transistor, the third PMOS transistor, the fourth PMOS transistor, the fifth PMOS transistor, and the sixth PMOS transistor are separately connected to a power voltage. Sources of the third NMOS transistor and the fourth NMOS transistor are separately grounded.

Preferably, the second comparison unit includes but is not limited to a thirteenth PMOS transistor, a fourteenth PMOS transistor, a ninth NMOS transistor, a tenth NMOS transistor, an eleventh NMOS transistor, a twelfth NMOS transistor, a fifteenth PMOS transistor, a sixteenth PMOS transistor, a thirteenth NMOS transistor, and a fourteenth NMOS transistor. A gate of the fourteenth PMOS transistor is connected to a low-potential reference voltage output end of the reference voltage generation circuit. A drain of the fourteenth PMOS transistor, a drain of the tenth NMOS transistor, a gate of the ninth NMOS transistor, a drain and a gate of the thirteenth NMOS transistor, and a gate of the fourteenth NMOS transistor are connected to one another. A gate of the thirteenth PMOS transistor is connected to the port detection conversion circuit. A drain of the thirteenth PMOS transistor, a drain of the ninth NMOS transistor, a gate of the tenth NMOS transistor, a drain and a gate of the eleventh NMOS transistor, and a gate of the twelfth NMOS transistor are connected to one another. Sources of the thirteenth PMOS transistor and the fourteenth PMOS transistor are separately connected to a second current bias end of the dynamic bias current generation circuit. A drain of the twelfth NMOS transistor, a drain and a gate of the fifteenth PMOS transistor, and a gate of the sixteenth PMOS transistor are connected to one another. A drain of the sixteenth PMOS transistor, a drain of the fourteenth NMOS transistor, and an input end of the second shaping drive unit are connected to one another. Sources of the fifteenth PMOS transistor and the sixteenth PMOS transistor are separately connected to a power voltage. Sources of the ninth NMOS transistor, the tenth NMOS transistor, the eleventh NMOS transistor, the twelfth NMOS transistor, the thirteenth NMOS transistor, and the fourteenth NMOS transistor are separately grounded.

Preferably, the dynamic bias current generation circuit includes a starting unit, a low-power-consumption low-current generation unit, and a low-voltage high-current generation unit. The starting unit is connected to the low-power-consumption low-current generation unit. The low-power-consumption low-current generation unit is connected to the low-voltage high-current generation unit.

Preferably, the low-power-consumption low-current generation unit includes a self-bias current generation module, a current mirror module, and a switch enable module. The self-bias current generation module is separately connected to the starting unit and the current mirror module. The current mirror module is connected to the switch enable module.

Preferably, the self-bias current generation module includes a twentieth NMOS transistor, a twenty-first NMOS transistor, a sixth resistor, a twentieth PMOS transistor, a twenty-first PMOS transistor, and a twenty-second PMOS transistor. A drain of the twentieth NMOS transistor is separately connected to one end of the sixth resistor, a gate of the twenty-first NMOS transistor, and the starting unit. A gate of the twentieth NMOS transistor, the other end of the sixth resistor, a drain of the twentieth PMOS transistor, and the current mirror module are connected to one another. A gate of the twentieth PMOS transistor, the starting unit, a gate and a drain of the twenty-first PMOS transistor, a drain of the twenty-second PMOS transistor, a drain of the twenty-first NMOS transistor, and the current mirror module are connected to one another. Sources of the twentieth PMOS transistor, the twenty-second PMOS transistor, and the twenty-first PMOS transistor are separately connected to a power voltage. Sources of the twentieth NMOS transistor and the twenty-first NMOS transistor are separately grounded.

Preferably, the low-voltage high-current generation unit includes a twenty-fifth PMOS transistor, a twenty-sixth PMOS transistor, a twenty-ninth PMOS transistor, a twenty-fourth NMOS transistor, a twenty-fifth NMOS transistor, a twenty-sixth NMOS transistor, and a seventh resistor; a drain of the twenty-fifth PMOS transistor is connected to a drain of the twenty-fourth PMOS transistor; a gate of the twenty-fifth PMOS transistor, a gate and a drain of the twenty-sixth PMOS transistor, and a drain of the twenty-fifth NMOS transistor are connected to one another; a gate of the twenty-fifth NMOS transistor, a gate and a drain of the twenty-sixth NMOS transistor, a gate of the twenty-fourth NMOS transistor, and one end of the seventh resistor are connected to one another; a drain of the twenty-fourth NMOS transistor is connected to a drain of the twenty-third NMOS transistor; the other end of the seventh resistor is connected to a drain of the twenty-ninth PMOS transistor; sources of the twenty-fifth PMOS transistor, the twenty-sixth PMOS transistor, and the twenty-ninth PMOS transistor are separately connected to a power voltage; and sources of the twenty-fourth NMOS transistor and the twenty-fifth NMOS transistor are separately grounded.

According to a second aspect of the embodiments of the present disclosure, an integrated circuit chip is provided, which includes the above chip port state detection circuit.

According to a third aspect of the embodiments of the present disclosure, a communication terminal is provided, which includes the above chip port state detection circuit.

According to the chip port state detection circuit, the chip, and the communication terminal provided in the embodiments of the present disclosure, in one aspect, the port detection conversion circuit converts the state of the port to be detected into the corresponding voltage, and separately outputs the voltage to the first comparator and the second comparator. After the voltage is compared with the corresponding input reference voltages, the logic signals are output to the chip ID determination circuit to obtain the chip ID corresponding to the state of the port to be detected of the chip, such that the communication terminal identifies the chip, to distinguish the plurality of identical chips. In the other aspect, the dynamic bias current generation circuit separately provides bias currents and static operating points for the first comparator and the second comparator before completion of establishment of the power voltage from the start of establishment and after completion of establishment of the power voltage. Therefore, the state of the port to be detected of the chip is detected before the communication terminal identifies the chip, satisfying a requirement for fast detection of the port to be detected of the chip. In addition, requirements for low static power consumption and real-time detection of the chip port state detection circuit may be satisfied.

DETAILED DESCRIPTION

The following further describes technical content of the present disclosure in detail with reference to the accompanying drawings and specific embodiments.

Figure 1:
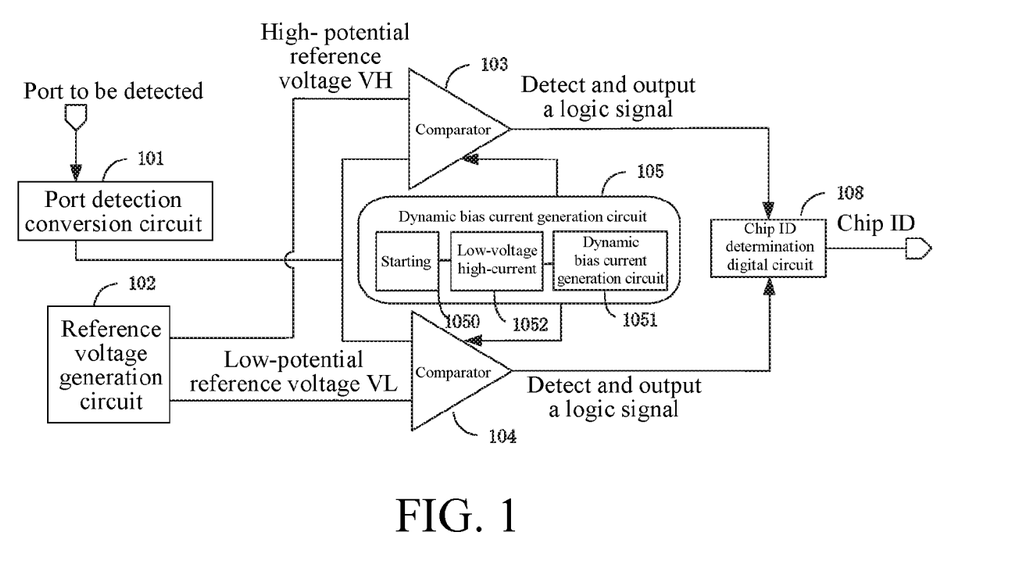
FIG. 1 is a block diagram of a principle of a chip port state detection circuit according to an embodiment of the present disclosure.

To deal with a change of a state of a port of a chip in use, satisfy requirements for a high speed, low power consumption, and real-time detection in a chip port detection process, and accurately distinguish a plurality of identical chips in a communication terminal, as shown in FIG. 1, an embodiment of the present disclosure provides a chip port state detection circuit, including a port detection conversion circuit 101, a reference voltage generation circuit 102, a first comparator 103, a second comparator 104, a dynamic bias current generation circuit 105, and a chip ID determination circuit 108. The port detection conversion circuit 101, the reference voltage generation circuit 102, and the dynamic bias current generation circuit 105 are separately connected to the first comparator 103 and the second comparator 104. The first comparator 103 and the second comparator 104 are separately connected to the chip ID determination circuit 108.

The port detection conversion circuit 101 is connected to a port to be detected of a chip to convert a state of the port to be detected into a corresponding voltage and separately output the voltage to the first comparator 103 and the second comparator 104. The first comparator 103 and the second comparator 104 use a voltage VH and a voltage VL provided by the reference voltage generation circuit 102 as input reference voltages, compare the voltage output by the port detection conversion circuit 101 with the input reference voltages, and then output logic signals to the chip ID determination circuit 108. The chip ID determination circuit outputs a chip ID corresponding to the state of the port to be detected according to the logic signals, such that the communication terminal identifies the chip, to distinguish the plurality of identical chips.

Figure 2A:
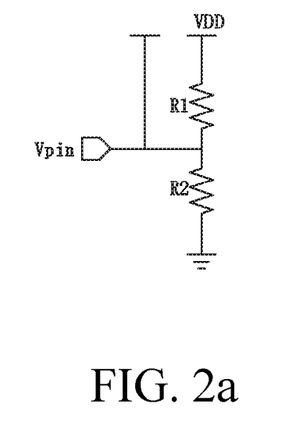
FIG. 2a to FIG. 2c are respectively circuit diagrams of an embodiment of a port detection conversion circuit in a chip port state detection circuit according to an embodiment of the present disclosure.
Figure 2B:
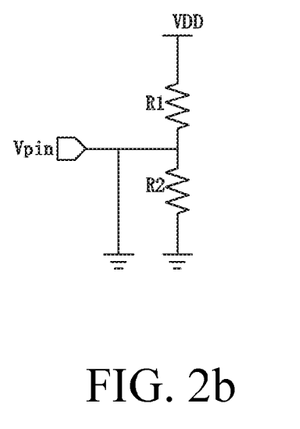
Figure 2C:
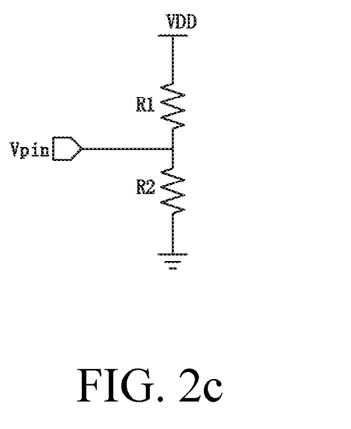

As shown in FIG. 2a to FIG. 2c, the port detection conversion circuit 101 includes but is not limited to a first resistor R1 and a second resistor R2 that are connected in series. A port to be detected Vpin of the chip is connected to a connection point between the first resistor R1 and the second resistor R2. The other end of the first resistor R1 is connected to a power voltage VDD. The other end of the second resistor is connected to a ground. Three states (a pulled-up state, a pulled-down state, and a suspended state) of the port to be detected of the chip are converted into three different corresponding voltages through voltage division of the first resistor R1 and the second resistor R2.

Specifically, when the port to be detected of the chip is in the pulled-up state, as shown in FIG. 2a, a potential of the port to be detected Vpin in the pulled-up state is the power voltage, that is, Vpin=VDD. When the port to be detected of the chip is in the pulled-down state, as shown in FIG. 2b, a potential of the port to be detected Vpin in the pulled-down state is the ground, that is, Vpin=0. When the port to be detected of the chip is in the suspended state, as shown in FIG. 2c, a potential of the port to be detected Vpin in the suspended state is obtained by performing voltage division on the power voltage VDD by using the first resistor R1 and the second resistor R2, that is, $$Vpin = \frac{R2}{R1 + R2} VDD.$$

Appropriate resistance value is required to be selected for the first resistor R1 and the second resistor R2 to compromise power consumption and a layout area.

Figure 3:
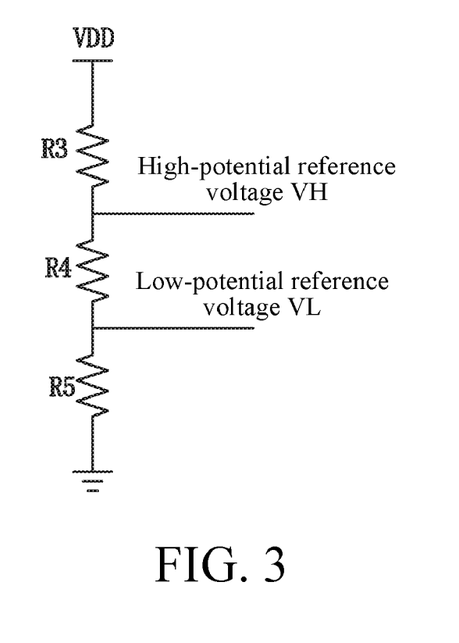
FIG. 3 is a circuit diagram of an embodiment of a reference voltage generation circuit in a chip port state detection circuit according to an embodiment of the present disclosure.

As shown in FIG. 3, the reference voltage generation circuit 102 includes but is not limited to a third resistor R3, a fourth resistor R4, and a fifth resistor R5 that are connected in series. The third resistor R3, the fourth resistor R4, and the fifth resistor R5 perform voltage division on the power voltage VDD to separately obtain the high-potential reference voltage VH and the low-potential reference voltage VL. The high-potential reference voltage VH and the low-potential reference voltage VL are correspondingly output to the first comparator 103 and the second comparator 104 as the input reference voltages. The high-potential reference voltage is $$VH = \frac{R4 + R5}{R3 + R4 + R5} VDD,$$

and the low-potential reference voltage is $$VL = \frac{R5}{R3 + R4 + R5} VDD.$$

Figure 4A:
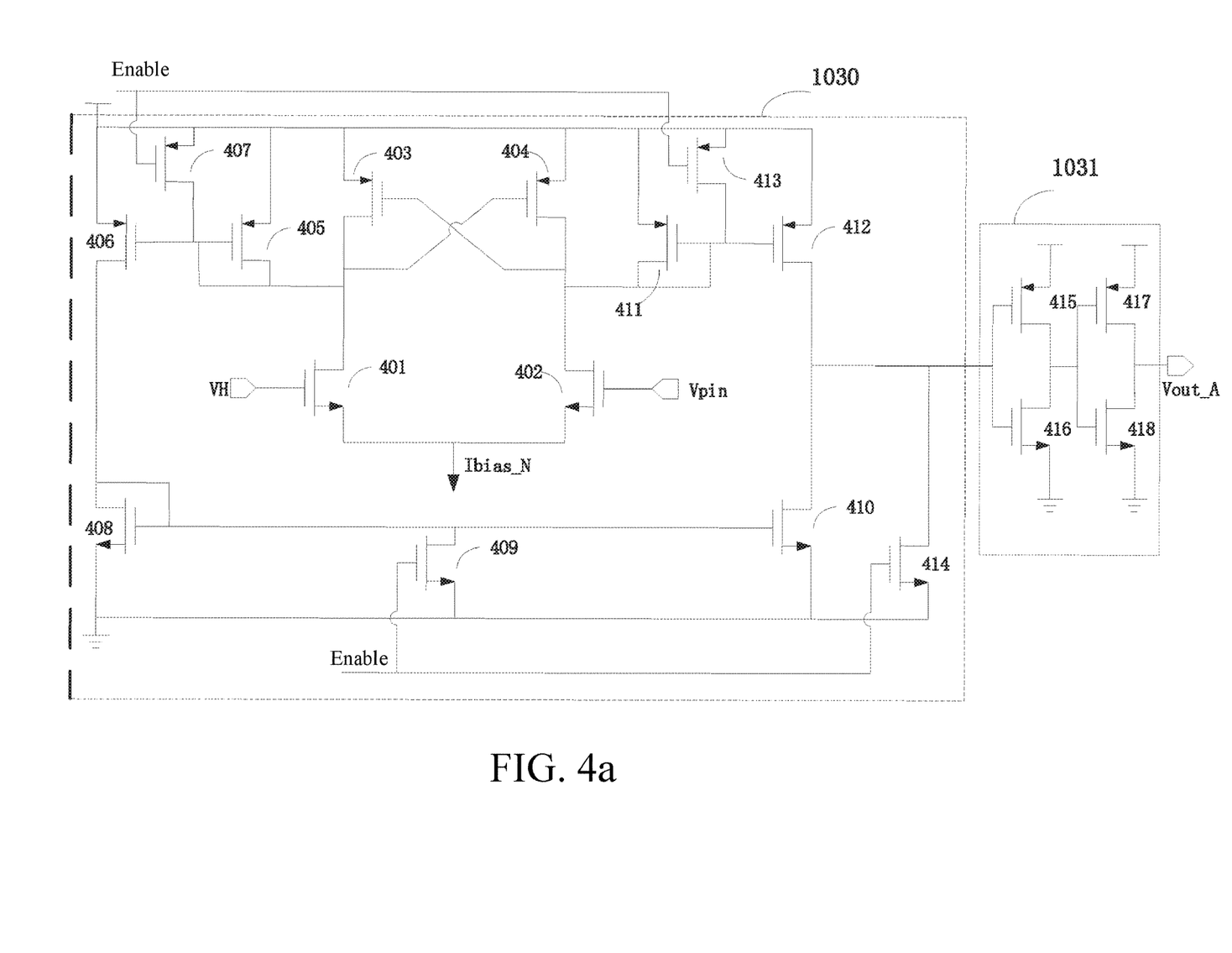
FIG. 4a is a circuit diagram of an embodiment of a first comparator in a chip port state detection circuit according to an embodiment of the present disclosure.

As shown in FIG. 4a, the first comparator 103 includes a first comparison unit 1030 and a first shaping drive unit 1031, and the first comparison unit 1030 is connected to the first shaping drive unit 1031.

The first comparison unit 1030 includes but is not limited to a first NMOS transistor 401, a second NMOS transistor 402, a first PMOS transistor 403, a second PMOS transistor 404, a third PMOS transistor 405, a fourth PMOS transistor 406, a third NMOS transistor 408, a fourth NMOS transistor 410, a fifth PMOS transistor 411, and a sixth PMOS transistor 412. A connection relationship between the components of the first comparison unit 1030 is as follows: a gate of the first NMOS transistor 401 is connected to a high-potential reference voltage output end of the reference voltage generation circuit 102. A drain of the first NMOS transistor 401, a drain of the first PMOS transistor 403, a gate of the second PMOS transistor 404, a drain and a gate of the third PMOS transistor 405, and a gate of the fourth PMOS transistor 406 are connected to one another. A gate of the second NMOS transistor 402 is connected to the port detection conversion circuit 101. A drain of the second NMOS transistor 402, a drain of the second PMOS transistor 404, a gate of the first PMOS transistor 403, a drain and a gate of the fifth PMOS transistor 411, and a gate of the sixth PMOS transistor 412 are connected to one another. Sources of the first NMOS transistor 401 and the second NMOS transistor 402 are separately connected to a first current bias end Ibias_N of the dynamic bias current generation circuit 105. A drain of the fourth PMOS transistor 406, a drain and a gate of the third NMOS transistor 408, and a gate of the fourth NMOS transistor 410 are connected to one another. A drain of the fourth NMOS transistor 410, a drain of the sixth PMOS transistor 412, and an input end of the first shaping drive unit 1031 are connected to one another. Sources of the first PMOS transistor 403, the second PMOS transistor 404, the third PMOS transistor 405, the fourth PMOS transistor 406, the fifth PMOS transistor 411, and the sixth PMOS transistor 412 are separately connected to a power voltage. Sources of the third NMOS transistor 408 and the fourth NMOS transistor 410 are separately grounded.

A working principle of the first comparator 103 is as follows: when the voltage that is received by the first comparator 103 and output by the port detection conversion circuit 101 and that corresponds to the state of the port to be detected Vpin is higher than the high-potential reference voltage VH provided by the reference voltage generation circuit 102, and a current flowing through the second NMOS transistor 402 is higher than that flowing through the first NMOS transistor 401, the first PMOS transistor 403 is turned on, so that a drain voltage of the third PMOS transistor 405 is pulled up. In this case, the third PMOS transistor 405, the fourth PMOS transistor 406, the third NMOS transistor 408, and the fourth NMOS transistor 410 are off, and the fifth PMOS transistor 411 and the sixth PMOS transistor 412 are on. The first comparator 103 outputs a high level through a voltage output end Vout A under a shaping drive action of the first shaping drive unit 1031 obtained by connecting each phase inverter including an eleventh PMOS transistor 415, a seventh NMOS transistor 416, a twelfth PMOS transistor 417 and an eighth NMOS transistor 418 in series.

When the voltage that is received by the first comparator 103 and output by the port detection conversion circuit 101 and that corresponds to the state of the port to be detected Vpin is lower than the high-potential reference voltage VH provided by the reference voltage generation circuit 102, and a current flowing through the second NMOS transistor 402 is lower than that flowing through the first NMOS transistor 401, the second PMOS transistor 404 is turned on, so that a drain voltage of the fifth PMOS transistor 411 is pulled up. In this case, the fifth PMOS transistor 411 and the sixth PMOS transistor 412 are off, and the third PMOS transistor 405, the fourth PMOS transistor 406, the third NMOS transistor 408, and the fourth NMOS transistor 410 are on. The first comparator 103 outputs a low level through a voltage output end Vout A under a shaping drive action of the first shaping drive unit 1031 obtained by connecting each phase inverter including an eleventh PMOS transistor 415, a seventh NMOS transistor 416, a twelfth PMOS transistor 417 and an eighth NMOS transistor 418 in series.

To control functional turn-on and turn-off of the first comparator 103, a ninth PMOS transistor 407 is connected between the gates of the third PMOS transistor 405 and the fourth PMOS transistor 406. A tenth PMOS transistor 413 is connected between the gates of the fifth PMOS transistor 411 and the sixth PMOS transistor 412. A fifth NMOS transistor 409 is connected between the gates of the third NMOS transistor 408 and the fourth NMOS transistor 410. A sixth NMOS transistor 414 is connected between the drains of the fourth NMOS transistor 410 and the sixth PMOS transistor 412 and the input end of the first shaping drive unit 1031. The ninth PMOS transistor 407, the tenth PMOS transistor 413, the fifth NMOS transistor 409, and the sixth NMOS transistor 414 are separately used as enable control transistors. An enable control signal is received through a gate of each enable control transistor, so as to control functional turn-on and turn-off of the first comparator 103.

Figure 4B:
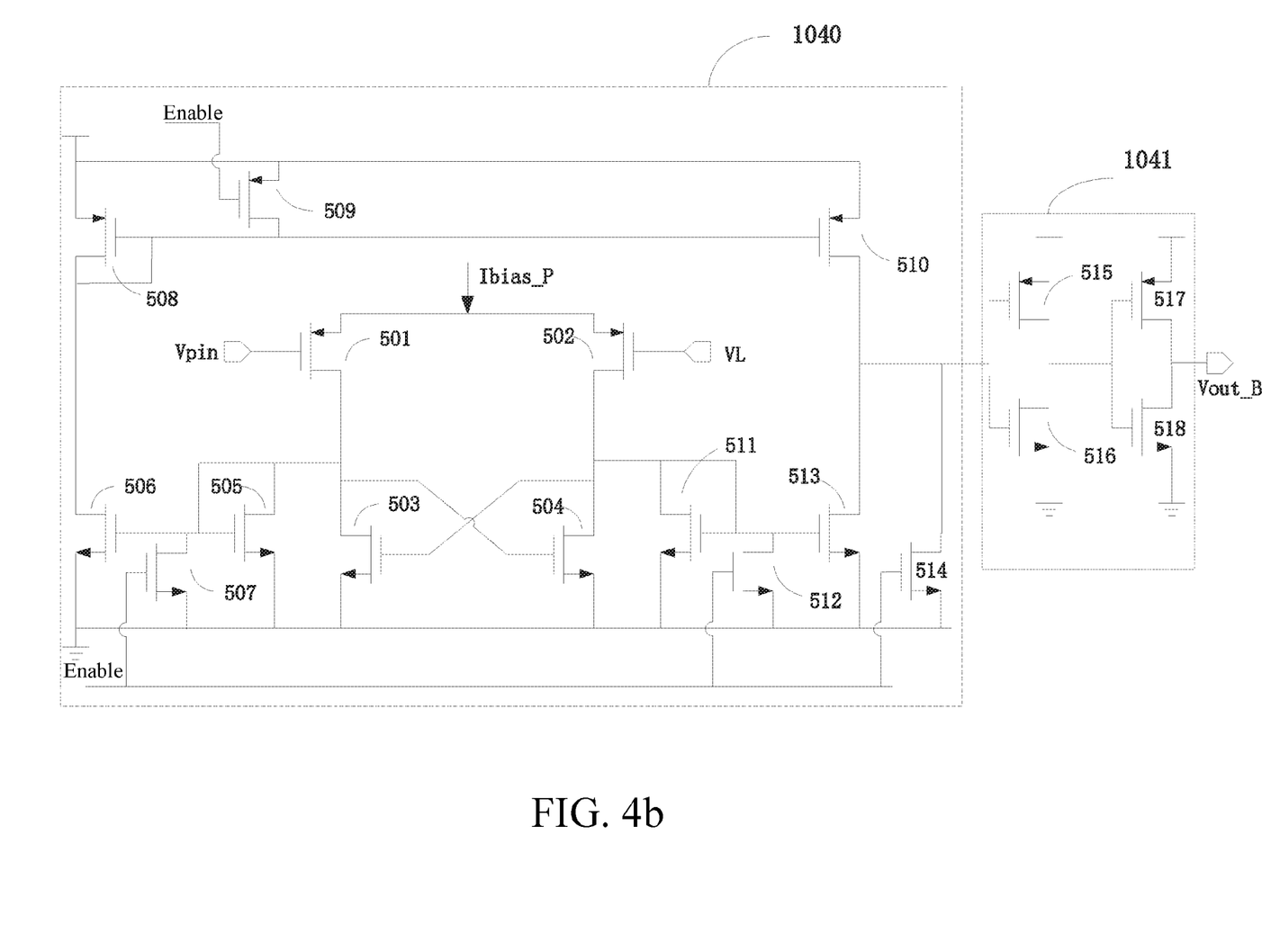
FIG. 4b is a circuit diagram of an embodiment of a second comparator in a chip port state detection circuit according to an embodiment of the present disclosure.

As shown in FIG. 4b, the second comparator 104 includes a second comparison unit 1040 and a second shaping drive unit 1041, and the second comparison unit 1040 is connected to the second shaping drive unit 1041. The second comparison unit 1040 includes but is not limited to a thirteenth PMOS transistor 501, a fourteenth PMOS transistor 502, a ninth NMOS transistor 503, a tenth NMOS transistor 504, an eleventh NMOS transistor 505, a twelfth NMOS transistor 506, a fifteenth PMOS transistor 508, a sixteenth PMOS transistor 510, a thirteenth NMOS transistor 511, and a fourteenth NMOS transistor 513. A connection relationship between the components of the second comparison unit 1030 is as follows: a gate of the fourteenth PMOS transistor 502 is connected to a low-potential reference voltage output end of the reference voltage generation circuit 102. A drain of the fourteenth PMOS transistor 502, a drain of the tenth NMOS transistor 504, a gate of the ninth NMOS transistor 503, a drain and a gate of the thirteenth NMOS transistor 511, and a gate of the fourteenth NMOS transistor 513 are connected to one another. A gate of the thirteenth PMOS transistor 501 is connected to the port detection conversion circuit 101. A drain of the thirteenth PMOS transistor 501, a drain of the ninth NMOS transistor 503, a gate of the tenth NMOS transistor 504, a drain and a gate of the eleventh NMOS transistor 505, and a gate of the twelfth NMOS transistor 506 are connected to one another. Sources of the thirteenth PMOS transistor 501 and the fourteenth PMOS transistor 502 are separately connected to a second current bias end Ibias_P of the dynamic bias current generation circuit 105. A drain of the twelfth NMOS transistor 506, a drain and a gate of the fifteenth PMOS transistor 508, and a gate of the sixteenth PMOS transistor 510 are connected to one another. A drain of the sixteenth PMOS transistor 510, a drain of the fourteenth NMOS transistor 513, and an input end of the second shaping drive unit 1041 are connected to one another. Sources of the fifteenth PMOS transistor 508 and the sixteenth PMOS transistor 510 are separately connected to a power voltage. Sources of the ninth NMOS transistor 503, the tenth NMOS transistor 504, the eleventh NMOS transistor 505, the twelfth NMOS transistor 506, the thirteenth NMOS transistor 511, and the fourteenth NMOS transistor 513 are separately grounded.

A working principle of the second comparator 104 is as follows: when the voltage that is received by the second comparator 104 and output by the port detection conversion circuit 101 and that corresponds to the state of the port to be detected Vpin is higher than the low-potential reference voltage VL provided by the reference voltage generation circuit 102, and a current flowing through the fourteenth PMOS transistor 502 is higher than that flowing through the thirteenth PMOS transistor 501, the ninth NMOS transistor 503 is turned on, so that a drain voltage of the eleventh NMOS transistor 505 is pulled up. In this case, the eleventh NMOS transistor 505, the twelfth NMOS transistor 506, the fifteenth PMOS transistor 508, and the sixteenth PMOS transistor 510 are off, and the thirteenth NMOS transistor 511 and the fourteenth NMOS transistor 513 are on. The second comparator 104 outputs a low level through a voltage output end Vout B under a shaping drive action of the second shaping drive unit 1041 obtained by connecting each phase inverter including a seventeenth PMOS transistor 515, a fifteenth NMOS transistor 516, an eighteenth PMOS transistor 517 and a sixteenth NMOS transistor 518 in series.

When the voltage that is received by the second comparator 104 and output by the port detection conversion circuit 101 and that corresponds to the state of the port to be detected Vpin is lower than the low-potential reference voltage VL provided by the reference voltage generation circuit 102, and a current flowing through the fourteenth PMOS transistor 502 is lower than that flowing through the thirteenth PMOS transistor 501, the tenth NMOS transistor 504 is turned on, so that a drain voltage of the thirteenth NMOS transistor 511 is pulled up. In this case, the thirteenth NMOS transistor 511 and the fourteenth NMOS transistor 513 are off, and the eleventh NMOS transistor 505, the twelfth NMOS transistor 506, the fifteenth PMOS transistor 508, and the sixteenth PMOS transistor 510 are on. The second comparator 104 outputs a high level through a voltage output end Vout B under a shaping drive action of the second shaping drive unit 1041 obtained by connecting each phase inverter including a seventeenth PMOS transistor 515, a fifteenth NMOS transistor 516, an eighteenth PMOS transistor 517 and a sixteenth NMOS transistor 518 in series.

To control functional turn-on and turn-off of the second comparator 104, a nineteenth PMOS transistor 509 is connected between the gates of the fifteenth PMOS transistor 508 and the sixteenth PMOS transistor 510. A seventeenth NMOS transistor 507 is connected between the gates of the eleventh NMOS transistor 505 and the twelfth NMOS transistor 506. An eighteenth NMOS transistor 512 is connected between the gates of the thirteenth NMOS transistor 511 and the fourteenth NMOS transistor 513. A nineteenth NMOS transistor 514 is connected between the drains of the sixteenth PMOS transistor 510 and the fourteenth NMOS transistor 513 and the input end of the second shaping drive unit 1041. The nineteenth PMOS transistor 509, the seventeenth NMOS transistor 507, the eighteenth NMOS transistor 512, and the nineteenth NMOS transistor 514 are separately used as enable control transistors. An enable control signal is received through a gate of each enable control transistor, so as to control functional turn-on and turn-off of the second comparator 104.

Different states of the port to be detected of the chip correspond to different voltages, and further, the first comparator 103 and the second comparator 104 correspondingly output different logic signals. The logic signals are high levels or low levels output by the voltage output ends of the first comparator 103 and the second comparator 104. When the port to be detected of the chip is in the pulled-up state, the first comparator 103 outputs a high level, and the second comparator 104 outputs a low level. When the port to be detected of the chip is in the pulled-down state, the first comparator 103 outputs a low level, and the second comparator 104 outputs a high level. When the port to be detected of the chip is in the suspended state, the first comparator 103 outputs a low level, and the second comparator 104 outputs a low level.

Different logic signals output by the first comparator 103 and the second comparator 104 are output to the chip ID determination circuit 108. The chip ID determination circuit 108 determines, according to a pre-designed correspondence between logic signals output by the first comparator 103 and the second comparator 104 and a chip ID, logic signals actually output by the first comparator 103 and the second comparator 104 to determine a chip ID of each chip used in the same communication terminal. Therefore, one-to-one correspondence between a chip port state and a chip ID is implemented, and the communication terminal may identify each identical chip. The chip ID includes but is not limited to a chip product ID, an operator ID, and the like.

In an embodiment of the present disclosure, the chip ID determination circuit 108 may include a plurality of logic AND gates, logic NOT gates, logic OR gate circuits, and the like. In addition, a port of the chip corresponds to three states, so that the port corresponds to three chip IDs, that is, three identical chips are allowed in a same application environment. Therefore, if more identical chips are required in a same application environment, a quantity of ports to be detected of the chips may be determined according to a quantity of required chips, and each port to be detected is connected to the port detection conversion circuit of the chip port state detection circuit. For example, if five identical chips are required in a same application environment, two ports to be detected of the chip are required to be separately connected to the port detection conversion circuit.

Figure 5:
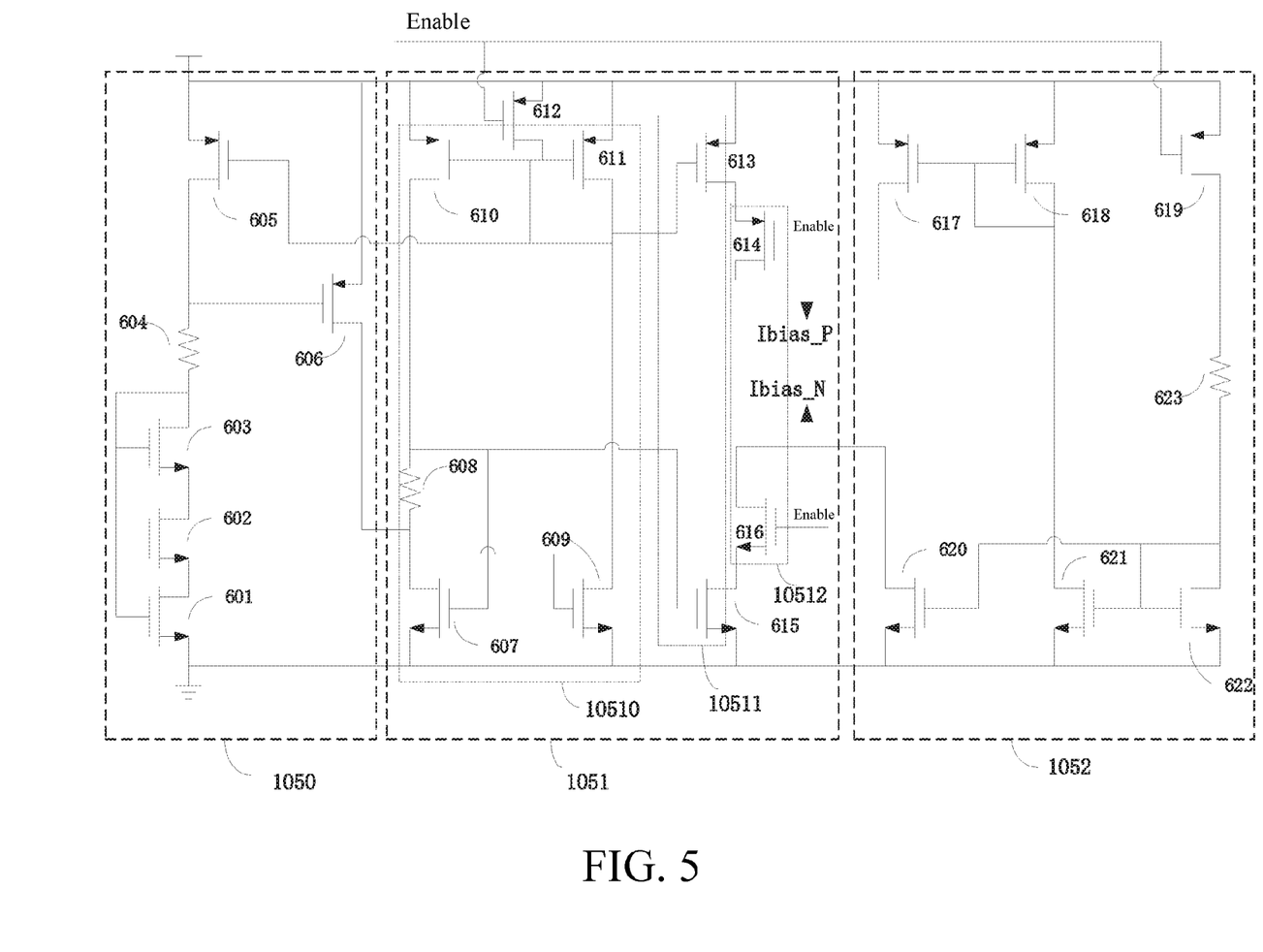
FIG. 5 is a circuit diagram of an embodiment of a dynamic bias current generation circuit in a chip port state detection circuit according to an embodiment of the present disclosure.

The dynamic bias current generation circuit 105 is configured to provide bias currents for the first comparator 103 and the second comparator 104, such that the first comparator 103 and the second comparator 104 may operate normally. As shown in FIG. 5, the dynamic bias current generation circuit 105 includes a starting unit 1050, a low-power-consumption low-current generation unit 1051, and a low-voltage high-current generation unit 1052. The starting unit 1050 is connected to the low-power-consumption low-current generation unit 1051. The low-power-consumption low-current generation unit 1051 is connected to the low-voltage high-current generation unit 1052.

When the low-power-consumption low-current generation unit 1051 and the low-voltage high-current generation unit 1052 separately receive a high-level enable control signal, the low-power-consumption low-current generation unit 1051 is on, and the low-voltage high-current generation unit 1052 is off. Therefore, the bias currents are provided for the first comparator 103 and the second comparator 104 after completion of establishment of the power voltage, to satisfy requirements for low static power consumption and real-time detection of the chip port state detection circuit.

When the low-voltage high-current generation unit 1052 and the low-power-consumption low-current generation unit 1051 separately receive a low-level enable control signal, the low-voltage high-current generation unit 1052 is on, and the low-power-consumption low-current generation unit 1051 is off. Therefore, the bias currents are provided for the first comparator 103 and the second comparator 104 before completion of establishment of the power voltage from the start of establishment, to ensure that the state of the port to be detected of the chip is detected before the communication terminal identifies the chip, satisfying a requirement for fast detection of the port to be detected of the chip.

As shown in FIG. 5, the low-power-consumption low-current generation unit 1051 a self-bias current generation module 10510, a current mirror module 10511, and a switch enable module 10512. The self-bias current generation module 10510 is separately connected to the starting unit 1050 and the current mirror module 10511. The current mirror module 10511 is connected to the switch enable module 10512. The self-bias current generation module 10510 includes a twentieth NMOS transistor 607, a twenty-first NMOS transistor 609, a sixth resistor 608, a twentieth PMOS transistor 610, a twenty-first PMOS transistor 611, and a twenty-second PMOS transistor 612. A specific connection relationship is as follows: a drain of the twentieth NMOS transistor 607 is separately connected to one end of the sixth resistor 608, a gate of the twenty-first NMOS transistor 609, and the starting unit 1050. A gate of the twentieth NMOS transistor 607, the other end of the sixth resistor 608, a drain of the twentieth PMOS transistor 610, and the current mirror module 10511 are connected to one another. A gate of the twentieth PMOS transistor 610, the starting unit 1050, a gate and a drain of the twenty-first PMOS transistor 611, a drain of the twenty-second PMOS transistor 612, a drain of the twenty-first NMOS transistor 609, and the current mirror module 10511 are connected to one another. Sources of the twentieth PMOS transistor 610, the twenty-second PMOS transistor 612, and the twenty-first PMOS transistor 611 are separately connected to a power voltage. Sources of the twentieth NMOS transistor 607 and the twenty-first NMOS transistor 609 are separately grounded.

As shown in FIG. 5, the current mirror module 10511 includes a twenty-third PMOS transistor 613 and a twenty-second NMOS transistor 615. A gate of the twenty-third PMOS transistor 613, the gate of the twentieth PMOS transistor 610, the starting unit 1050, the gate and the drain of the twenty-first PMOS transistor 611, the drain of the twenty-second PMOS transistor 612, and the drain of the twenty-first NMOS transistor 609 are connected to one another. A drain of the twenty-third PMOS transistor 613 is connected to the switch enable module 10512. A source of the twenty-third PMOS transistor 613 is connected to the power voltage. A gate of the twenty-second NMOS transistor 615, the gate of the twentieth NMOS transistor 607, the other end of the sixth resistor 608, and the drain of the twentieth PMOS transistor 610 are connected to one another. A drain of the twenty-second NMOS transistor 615 is connected to the switch enable module 10512. A source of the twenty-second NMOS transistor 615 is grounded.

As shown in FIG. 5, the switch enable module 10512 includes a twenty-fourth PMOS transistor 614 and a twenty-third NMOS transistor 616. A source of the twenty-fourth PMOS transistor 614 is connected to the drain of the twenty-third PMOS transistor 613. A drain of the twenty-fourth PMOS transistor 614 is connected to the low-voltage high-current generation unit 1052 to form the first current bias end Ibias_N of the dynamic bias current generation circuit 105. A source of the twenty-third NMOS transistor 616 is connected to the drain of the twenty-second NMOS transistor 615. A drain of the twenty-third NMOS transistor 616 is connected to the low-voltage high-current generation unit 1052 to form the second current bias end Ibias_P of the dynamic bias current generation circuit 105.

As shown in FIG. 5, the low-voltage high-current generation unit 1052 includes a twenty-fifth PMOS transistor 617, a twenty-sixth PMOS transistor 618, a twenty-sixth PMOS transistor 619, a twenty-fourth NMOS transistor 620, a twenty-fifth NMOS transistor 621, a twenty-sixth NMOS transistor 622, and a seventh resistor 623. A specific connection relationship is as follows: a drain of the twenty-fifth PMOS transistor 617 is connected to a drain of the twenty-fourth PMOS transistor 614. A gate of the twenty-fifth PMOS transistor 617, a gate and a drain of the twenty-sixth PMOS transistor 618, and a drain of the twenty-fifth NMOS transistor 621 are connected to one another. A gate of the twenty-fifth NMOS transistor 621, a gate and a drain of the twenty-sixth NMOS transistor 622, a gate of the twenty-fourth NMOS transistor 620, and one end of the seventh resistor 623 are connected to one another. A drain of the twenty-fourth NMOS transistor 620 is connected to a drain of the twenty-third NMOS transistor 616. The other end of the seventh resistor 623 is connected to a drain of the twenty-sixth PMOS transistor 619. Sources of the twenty-fifth PMOS transistor 617, the twenty-sixth PMOS transistor 618, and the twenty-sixth PMOS transistor 619 are separately connected to a power voltage. Sources of the twenty-fourth NMOS transistor 620 and the twenty-fifth NMOS transistor 621 are separately grounded.

As shown in FIG. 5, the starting unit 1050 is configured to normally start the low-power-consumption low-current generation unit 1051 avoiding a degeneracy point, so as to ensure stability of the low-power-consumption low-current generation unit at a required output point. The starting unit 1050 includes a twenty-seventh NMOS transistor 601, a twenty-eighth NMOS transistor 602, a twenty-ninth NMOS transistor 603, a twenty-seventh PMOS transistor 605, a twenty-eighth PMOS transistor 606, and an eighth resistor 604. A specific connection relationship is as follows: a gate of the twenty-seventh NMOS transistor 601, a gate of the twenty-eighth NMOS transistor 602, a gate and a drain of the twenty-ninth NMOS transistor 603, and one end of the eighth resistor 604 are connected to one another. A drain of the twenty-seventh NMOS transistor 601 is connected to a source of the twenty-eighth NMOS transistor 602. A drain of the twenty-eighth NMOS transistor 602 is connected to a source of the twenty-ninth NMOS transistor 603. The other end of the eighth resistor 604 is separately connected to a drain of the twenty-seventh PMOS transistor 605 and a gate of the twenty-eighth PMOS transistor 606. A gate of the twenty-seventh PMOS transistor 605, the gate of the twenty-third PMOS transistor 613, the gate of the twentieth PMOS transistor 610, the gate and the drain of the twenty-first PMOS transistor 611, the drain of the twenty-second PMOS transistor 612, and the drain of the twenty-first NMOS transistor 609 are connected to one another. A drain of the twenty-eighth PMOS transistor 606 is separately connected to the drain of the twentieth NMOS transistor 607, one end of the sixth resistor 608, and the gate of the twenty-first NMOS transistor 609. Sources of the twenty-seventh PMOS transistor 605 and the twenty-eighth PMOS transistor 606 are separately connected to the power voltage. A source of the twenty-seventh NMOS transistor 601 is grounded.

A working principle of the dynamic bias current generation circuit 105 is as follows: when the enable control signal is at a low level, that is, before completion of establishment of the power voltage from the start of establishment, the twenty-second PMOS transistor 612 is turned on, and the twenty-fourth PMOS transistor 614 and the twenty-third NMOS transistor 616 are separately turned off, so that the low-power-consumption low-current generation unit 1051 is turned off. In this case, the self-bias current generation module 10510 of the low-power-consumption low-current generation unit 1051 is off, and further cannot provide the bias currents and static operating points for the first comparator 103 and the second comparator 104. The twenty-sixth PMOS transistor 619 is turned on, so that the low-voltage high-current generation unit 1052 is turned on, and generates the bias current through the twenty-sixth PMOS transistor 619, the seventh resistor 623, and the twenty-sixth NMOS transistor 622. In one aspect, the bias current is copied through the twenty-fourth NMOS transistor 620, and the bias current and the static operating point are provided for the first comparator 103 from the first current bias end Ibias_N. In the other aspect, the bias current is copied through the twenty-fifth NMOS transistor 621, a copied bias current is mirrored through the twenty-fifth PMOS transistor 617 and the twenty-sixth PMOS transistor 618, and then the bias current and the static operating point are provided for the second comparator 104 from the second current bias end Ibias_P. Therefore, it is ensured that the state of the port to be detected of the chip is detected before the communication terminal identifies the chip, satisfying the requirement for fast detection of the port to be detected of the chip.

When the enable control signal is at a high level, that is, after completion of establishment of the power voltage, the twenty-sixth PMOS transistor 619 is turned off, so that the low-voltage high-current generation unit 1052 is off. In this case, the low-voltage high-current generation unit 1052 cannot provide the bias currents and the static operating points for the first comparator 103 and the second comparator 104. The twenty-second PMOS transistor 612 is turned off, and the twenty-fourth PMOS transistor 614 and the twenty-third NMOS transistor 616 are separately turned on, so that the low-power-consumption low-current generation unit 1051 is turned on. In this case, the self-bias current generation module 10510 generates the bias current by using a principle of $$\frac{\Delta VGS}{R}.$$

After the bias current is separately mirrored through the twenty-third PMOS transistor 613 and the twenty-second NMOS transistor 615, the bias current and the static operating point are provided for the first comparator 103 from the corresponding current bias end through the twenty-fourth PMOS transistor 614 and the twenty-third NMOS transistor 616, so as to satisfy the requirements for low static power consumption and real-time detection of the chip port state detection circuit. When the enable control signal is at a high level, a branch circuit formed by the twenty-seventh NMOS transistor 601, the twenty-eighth NMOS transistor 602, the twenty-ninth NMOS transistor 603, the twenty-seventh PMOS transistor 605, and the eighth resistor 604 of the starting unit 1050 generates a current, so that a gate voltage of the twenty-eighth PMOS transistor 606 is pulled down, the twenty-eighth PMOS transistor is turned on, and the low-power-consumption low-current generation unit 1051 is further normally started avoiding the degeneracy point.

In addition, the chip port state detection circuit provided in this embodiment of the present disclosure may be used in an integrated circuit chip. Details about a specific structure of the chip port state detection circuit in the integrated circuit chip are not described again herein.

The chip port state detection circuit may further be used in a communication terminal as an important component of a detection circuit. The communication terminal mentioned herein is a computer device that may be used in a mobile environment and that supports a plurality of communication modes such as global system for mobile communication (GSM), enhanced data rate for GSM evolution (EDGE), time division-synchronous code division multiple access (TD_SCDMA), time division duplex-long term evolution (TDD_LTE), and frequency division duplex-long term evolution (FDD_LTE), including a mobile phone, a notebook computer, a tablet computer, a vehicle-mounted computer, and the like. In addition, the technical solution provided in this embodiment of the present disclosure is applicable to another detection circuit application scenario, for example, a communication base station.

According to the chip port state detection circuit, the chip, and the communication terminal provided in the embodiments of the present disclosure, in one aspect, the port detection conversion circuit converts the state of the port to be detected into the corresponding voltage, and separately outputs the voltage to the first comparator and the second comparator. After the voltage is compared with the corresponding input reference voltages, the logic signals are output to the chip ID determination circuit to obtain the chip ID corresponding to the state of the port to be detected of the chip, such that the communication terminal identifies the chip, to distinguish the plurality of identical chips. In the other aspect, the dynamic bias current generation circuit separately provides the bias currents and the static operating points for the first comparator and the second comparator before completion of establishment of the power voltage from the start of establishment and after completion of establishment of the power voltage. Therefore, the state of the port to be detected of the chip is detected before the communication terminal identifies the chip, satisfying the requirement for fast detection of the port to be detected of the chip. In addition, the requirements for low static power consumption and real-time detection of the chip port state detection circuit may be satisfied.

The above describes in detail the chip port state detection circuit, the chip, and the communication terminal provided in the present disclosure. Any significant modifications made by a person skilled in the art without departing from essential content of the present disclosure shall fall within the protection scope of the patent right of the present disclosure.

What is claimed is:

1. A chip port state detection circuit, comprising a port detection conversion circuit, a reference voltage generation circuit, a first comparator, a second comparator, a dynamic bias current generation circuit, and a chip identifier (ID) determination circuit, wherein the port detection conversion circuit, the reference voltage generation circuit, and the dynamic bias current generation circuit are separately connected to the first comparator and the second comparator; the first comparator and the second comparator are separately connected to the chip ID determination circuit;

the port detection conversion circuit is connected to a port to be detected of a chip to convert a state of the port to be detected into a corresponding voltage and separately output the voltage to the first comparator and the second comparator; the first comparator and the second comparator receive input reference voltages provided by the reference voltage generation circuit, compare the voltage output by the port detection conversion circuit with the input reference voltages, and then output logic signals to the chip ID determination circuit; and the chip ID determination circuit outputs a chip ID corresponding to the state of the port to be detected according to the logic signals, so as to distinguish a plurality of identical chips.

2. The chip port state detection circuit according to claim 1, wherein the port detection conversion circuit comprises but is not limited to a first resistor and a second resistor; the first resistor the second resistor are connected in series; and a connection point between the first resistor and the second resistor is connected to the port to be detected of the chip.

3. The chip port state detection circuit according to claim 1, wherein the reference voltage generation circuit comprises but is not limited to a third resistor, a fourth resistor, and a fifth resistor; the third resistor, the fourth resistor, and the fifth resistor are connected in series; and the third resistor, the fourth resistor, and the fifth resistor perform voltage division on a power voltage to separately obtain a high-potential reference voltage and a low-potential reference voltage.

4. The chip port state detection circuit according to claim 1, wherein the first comparator comprises a first comparison unit and a first shaping drive unit, and the first comparison unit is connected to the first shaping drive unit; and the second comparator comprises a second comparison unit and a second shaping drive unit, and the second comparison unit is connected to the second shaping drive unit.

5. The chip port state detection circuit according to claim 4, wherein
the first comparison unit comprises but is not limited to a first N-channel metal oxide semiconductor (NMOS) transistor, a second NMOS transistor, a first P-channel metal oxide semiconductor (PMOS) transistor, a second PMOS transistor, a third PMOS transistor, a fourth PMOS transistor, a third NMOS transistor, a fourth NMOS transistor, a fifth PMOS transistor, and a sixth PMOS transistor; a gate of the first NMOS transistor is connected to a high-potential reference voltage output end of the reference voltage generation circuit; a drain of the first NMOS transistor, a drain of the first PMOS transistor, a gate of the second PMOS transistor, a drain and a gate of the third PMOS transistor, and a gate of the fourth PMOS transistor are connected to one another; a gate of the second NMOS transistor is connected to the port detection conversion circuit; a drain of the second NMOS transistor, a drain of the second PMOS transistor, a gate of the first PMOS transistor, a drain and a gate of the fifth PMOS transistor, and a gate of the sixth PMOS transistor are connected to one another; sources of the first NMOS transistor and the second NMOS transistor are separately connected to a first current bias end of the dynamic bias current generation circuit; a drain of the fourth PMOS transistor, a drain and a gate of the third NMOS transistor, and a gate of the fourth NMOS transistor are connected to one another; a drain of the fourth NMOS transistor, a drain of the sixth PMOS transistor, and an input end of the first shaping drive unit are connected to one another; sources of the first PMOS transistor, the second PMOS transistor, the third PMOS transistor, the fourth PMOS transistor, the fifth PMOS transistor, and the sixth PMOS transistor are separately connected to a power voltage; and sources of the third NMOS transistor and the fourth NMOS transistor are separately grounded.

6. The chip port state detection circuit according to claim 4, wherein
the second comparison unit comprises but is not limited to a thirteenth PMOS transistor, a fourteenth PMOS transistor, a ninth NMOS transistor, a tenth NMOS transistor, an eleventh NMOS transistor, a twelfth NMOS transistor, a fifteenth PMOS transistor, a sixteenth PMOS transistor, a thirteenth NMOS transistor, and a fourteenth NMOS transistor; a gate of the fourteenth PMOS transistor is connected to a low-potential reference voltage output end of the reference voltage generation circuit; a drain of the fourteenth PMOS transistor, a drain of the tenth NMOS transistor, a gate of the ninth NMOS transistor, a drain and a gate of the thirteenth NMOS transistor, and a gate of the fourteenth NMOS transistor are connected to one another; a gate of the thirteenth PMOS transistor is connected to the port detection conversion circuit; a drain of the thirteenth PMOS transistor, a drain of the ninth NMOS transistor, a gate of the tenth NMOS transistor, a drain and a gate of the eleventh NMOS transistor, and a gate of the twelfth NMOS transistor are connected to one another; sources of the thirteenth PMOS transistor and the fourteenth PMOS transistor are separately connected to a second current bias end of the dynamic bias current generation circuit; a drain of the twelfth NMOS transistor, a drain and a gate of the fifteenth PMOS transistor, and a gate of the sixteenth PMOS transistor are connected to one another; a drain of the sixteenth PMOS transistor, a drain of the fourteenth NMOS transistor, and an input end of the second shaping drive unit are connected to one another; sources of the fifteenth PMOS transistor and the sixteenth PMOS transistor are separately connected to a power voltage; and sources of the ninth NMOS transistor, the tenth NMOS transistor, the eleventh NMOS transistor, the twelfth NMOS transistor, the thirteenth NMOS transistor, and the fourteenth NMOS transistor are separately grounded.

7. The chip port state detection circuit according to claim 1, wherein
the dynamic bias current generation circuit comprises a starting unit, a low-power-consumption low-current generation unit, and a low-voltage high-current generation unit; the starting unit is connected to the low-power-consumption low-current generation unit; and the low-power-consumption low-current generation unit is connected to the low-voltage high-current generation unit.

8. The chip port state detection circuit according to claim 7, wherein
the low-power-consumption low-current generation unit comprises a self-bias current generation module, a current mirror module, and a switch enable module, the self-bias current generation module is separately connected to the starting unit and the current mirror module, and the current mirror module is connected to the switch enable module.

9. The chip port state detection circuit according to claim 8, wherein
the self-bias current generation module comprises a twentieth NMOS transistor, a twenty-first NMOS transistor, a sixth resistor, a twentieth PMOS transistor, a twenty-first PMOS transistor, and a twenty-second PMOS transistor; a drain of the twentieth NMOS transistor is separately connected to one end of the sixth resistor, a gate of the twenty-first NMOS transistor, and the starting unit; a gate of the twentieth NMOS transistor, the other end of the sixth resistor, a drain of the twentieth PMOS transistor, and the current mirror module are connected to one another; a gate of the twentieth PMOS transistor, the starting unit, a gate and a drain of the twenty-first PMOS transistor, a drain of the twenty-second PMOS transistor, a drain of the twenty-first NMOS transistor, and the current mirror module are connected to one another; sources of the twentieth PMOS transistor, the twenty-second PMOS transistor, and the twenty-first PMOS transistor are separately connected to a power voltage; and sources of the twentieth NMOS transistor and the twenty-first NMOS transistor are separately grounded.

10. The chip port state detection circuit according to claim 8, wherein
the low-voltage high-current generation unit comprises a twenty-fifth PMOS transistor, a twenty-sixth PMOS transistor, a twenty-ninth PMOS transistor, a twenty-fourth NMOS transistor, a twenty-fifth NMOS transistor, a twenty-sixth NMOS transistor, and a seventh resistor; a drain of the twenty-fifth PMOS transistor is connected to a drain of the twenty-fourth PMOS transistor; a gate of the twenty-fifth PMOS transistor, a gate and a drain of the twenty-sixth PMOS transistor, and a drain of the twenty-fifth NMOS transistor are connected to one another; a gate of the twenty-fifth NMOS transistor, a gate and a drain of the twenty-sixth NMOS transistor, a gate of the twenty-fourth NMOS transistor, and one end of the seventh resistor are connected to one another; a drain of the twenty-fourth NMOS transistor is connected to a drain of the twenty-third NMOS transistor; the other end of the seventh resistor is connected to a drain of the twenty-ninth PMOS transistor; sources of the twenty-fifth PMOS transistor, the twenty-sixth PMOS transistor, and the twenty-ninth PMOS transistor are separately connected to a power voltage; and sources of the twenty-fourth NMOS transistor and the twenty-fifth NMOS transistor are separately grounded.

11. An integrated circuit chip, comprising the chip port state detection circuit according to claim 1.

12. A communication terminal, comprising the chip port state detection circuit according to claim 1.

* * * * *